United States Patent [19]
Ekrot et al.

[11] Patent Number: 5,986,882
[45] Date of Patent: Nov. 16, 1999

[54] ELECTRONIC APPARATUS HAVING REMOVABLE PROCESSOR/HEAT PIPE COOLING DEVICE MODULES THEREIN

[75] Inventors: Alexander C. Ekrot, Humble; James P. Shero, Houston, both of Tex.

[73] Assignee: Compaq Computer Corporation, Houston, Tex.

[21] Appl. No.: 08/951,932

[22] Filed: Oct. 16, 1997

[51] Int. Cl.⁶ .................................. G06F 1/16; H05K 7/20
[52] U.S. Cl. ........................... 361/687; 361/697; 361/699
[58] Field of Search .................................... 361/687, 699, 361/700, 695, 697, 715, 724–727; 454/184; 165/80.3, 122–126; 174/15.2

[56] References Cited

U.S. PATENT DOCUMENTS

| | | | |
|---|---|---|---|
| 5,218,514 | 6/1993 | Huynh et al. | 165/80.3 |
| 5,414,591 | 5/1995 | Kimura et al. | 361/695 |
| 5,486,982 | 1/1996 | Hsu | 361/726 |
| 5,528,454 | 6/1996 | Niklos | 361/695 |
| 5,544,012 | 8/1996 | Koike | 361/695 |
| 5,598,320 | 1/1997 | Toedtman et al. | 361/687 |
| 5,712,762 | 1/1998 | Webb | 361/687 |
| 5,793,608 | 8/1998 | Winick et al. | 361/695 |

*Primary Examiner*—Lynn D. Feild
*Assistant Examiner*—Lisa Lea-Edmonds
*Attorney, Agent, or Firm*—Konneker & Smith, P.C.

[57] ABSTRACT

A computer server unit has a closely spaced series of parallel, facing processor modules with inner edge portions thereof being operatively and removably received in socket connectors on a main system board within the server unit housing. Voltage regulation modules, in the form of power converter cards, are interdigitated with the series of processor modules, with each power converter card being operatively coupled to an associated one of the processor modules. To permit the efficient dissipation of operating heat from the closely spaced processor modules and voltage regulation modules, each removable processor module has a specially designed cooling module supported thereon for removal therewith from the system board. Each cooling module includes an evaporator plate secured to a side surface of one of the processor modules, a plurality of heat pipes extending parallel to the evaporator plate and having first end portions conductively secured to he evaporator plate and second end portions extending outwardly past an outer edge portion of the processor module and connected to a finned heat exchanger. Operating heat from each processor module is transferred through its evaporator plate and heat pipes to its finned heat exchanger. A fan system is provided to flow cooling air through the finned heat exchangers which are positioned outside of the spaces between the processor modules, thereby permitting the processor modules to be more closely spaced than they could be if conventional heat sink structures were mounted on side surfaces thereof.

25 Claims, 2 Drawing Sheets

ELECTRONIC APPARATUS HAVING REMOVABLE PROCESSOR/HEAT PIPE COOLING DEVICE MODULES THEREIN

BACKGROUND OF THE INVENTION

1. Field of the Invention

The present invention generally relates to the cooling of heat-generating components in electronic apparatus and, in a preferred embodiment thereof, more particularly relates to the forced air cooling of a closely spaced series of processor modules in a computer server unit.

2. Description of Related Art

As their operating speeds and capacities keep increasing, it is becoming increasingly difficult to provide adequate cooling for processors and other high heat-generating components used in electronic equipment. An example of this problem is in the case of computer devices, such as server units, utilizing closely spaced groups of high speed processor modules. Aggravating this increasing heat dissipation requirement for various computer components as they utilize higher and higher operating speeds is the corresponding requirement of placing the components closer and closer together to reduce the critical signal path lengths of the various components.

For example, in the case of computer processor modules the customary method of dissipating processor operating heat has been to place a heat sink member, typically a finned metal heat exchanger, on a side of the processor and flow a stream of cooling air across the heat sink member to carry away heat conducted thereto by the processor. However, when it becomes necessary to group multiple high speed processors in a facing, side-by-side row arrangement such as in a multi-processor server unit the use of this traditional heat dissipation technique becomes impractical for two primary reasons.

First, the requirement of positioning the multiple processors close enough to one another to avoid undesirably long signal path lengths to and from the processors makes it difficult, due to the side-to-side spacing of adjacent pairs of processors, to mount sufficiently large heat sink members on side surfaces of the processors. Second, it is desirable to position the DC/DC power converters (also commonly referred to as voltage regulation modules or circuit boards, or simply voltage regulators) which are used in conjunction with the processors as close to their associated processors as possible. This is desirable because instantaneous power change requirements found in modern microprocessors require short, low inductance supply paths between the voltage regulators and the processors. Accordingly, a highly preferable orientation of these voltage regulation circuit boards is one in which they are interdigitated with their associated processor modules—i.e., placed in the gaps between the processors in a parallel relationship with the processors. This preferred placement of the DC/DC convertors further diminishes the space between adjacent processors which would otherwise be available for their side-mounted heat sink members.

In addition to these two design problems which are presented in instances where it is desirable to position processors or other high heat-generating electronic components in a closely spaced array, the very positioning of the components in such a closely spaced array substantially limits the cooling air flow directional design flexibility. For example, in the case where the processors with their conventional side-mounted heat sinks are arranged in a closely spaced row in which the parallel processors face one another, the cooling air flow must be directed parallel to the processor sides so that it can pass through the spaces between the adjacent facing pairs of processors. The cooling air flow cannot be directed perpendicular to the processor sides since this would substantially preclude cooling air flow across the side-mounted processor heat sinks. An additional concern is the fact that the DC/DC convertor modules can generate a considerable amount of operating heat as well.

As can readily be seen from the foregoing, a need exists for improved heat dissipation apparatus useable in conjunction with closely spaced arrays of high heat-generating electronic components such as computer processor modules. It is to this need that the present invention is directed.

SUMMARY OF THE INVENTION

In carrying out principles of the present invention, in accordance with a preferred embodiment thereof, electronic apparatus is provided which is representatively a computer server unit forming a portion of a computer system. The server unit includes a spaced series of heat-generating structures, illustratively processor modules, having opposite sides and being disposed within a spatial envelope in a facing, side-by-side relationship. A series of heat transfer structures, preferably thermosyphoning heat pipes, have first longitudinal portions secured to sides of the processor modules and operative to receive processor operating heat therefrom, and second longitudinal portions disposed outwardly of the spatial processor module envelope. Preferably, side portions of the first longitudinal heat pipe portions are secured to metal evaporator plates which, in turn, are secured to sides of the processor modules. The heat pipes extend parallel to the processor module sides, with the second heat pipe longitudinal portions extending outwardly past peripheral side edge portions of the processor modules.

A series of heat exchanger structures, preferably finned heat exchangers, are secured to the second longitudinal heat pipe portions and are operative to receive heat therefrom. Also incorporated in the server unit is a fluid flow system operative to flow a cooling fluid across the heat exchanger structures, whereby operating heat from the spaced series of processor modules is transferred sequentially to the collector plates, through the heat pipes to the heat exchangers, and then to the moving cooling fluid.

In a preferred embodiment of the server unit, the processor modules are arranged in a row and have connector edge portions removably insertable into socket connectors on a system circuit board, and each removable processor module has secured thereto an associated cooling module including a collector plate, a heat exchanger, and at least one thermosyphoning heat pipe interconnected between the collector plate and the heat exchanger. The fluid flow system, in a preferred embodiment thereof, is a push-pull fan system operative to flow air across the finned heat exchangers disposed outwardly of the spatial envelope of the processor modules.

The positioning of the heat exchangers in an outwardly spaced relationship with the spatial envelope of the processor modules permits the module-to-module spacing to be significantly reduced, to correspondingly reduce their associated signal path lengths. Because the cooling air flow is positioned outside of the spatial envelope of the processor module array the air flow does not have to be routed between the processor modules to cool them. This accordingly permits associated voltage regulation modules, representatively in the form of power converter cards, to be compactly interdigitated with the processor modules without interfering with the cooling thereof.

The positioning of the finned heat exchangers outside of the spatial envelope of the processor module array yields the additional benefit of providing greatly enhanced cooling air flow directional flexibility. For example, in the illustrated preferred embodiment of the server unit, the cooling air flow is perpendicular to the sides of the processor modules. However, such air flow may also be, for example, parallel to the sides of such processor modules.

DETAILED DESCRIPTION

Figure 1:
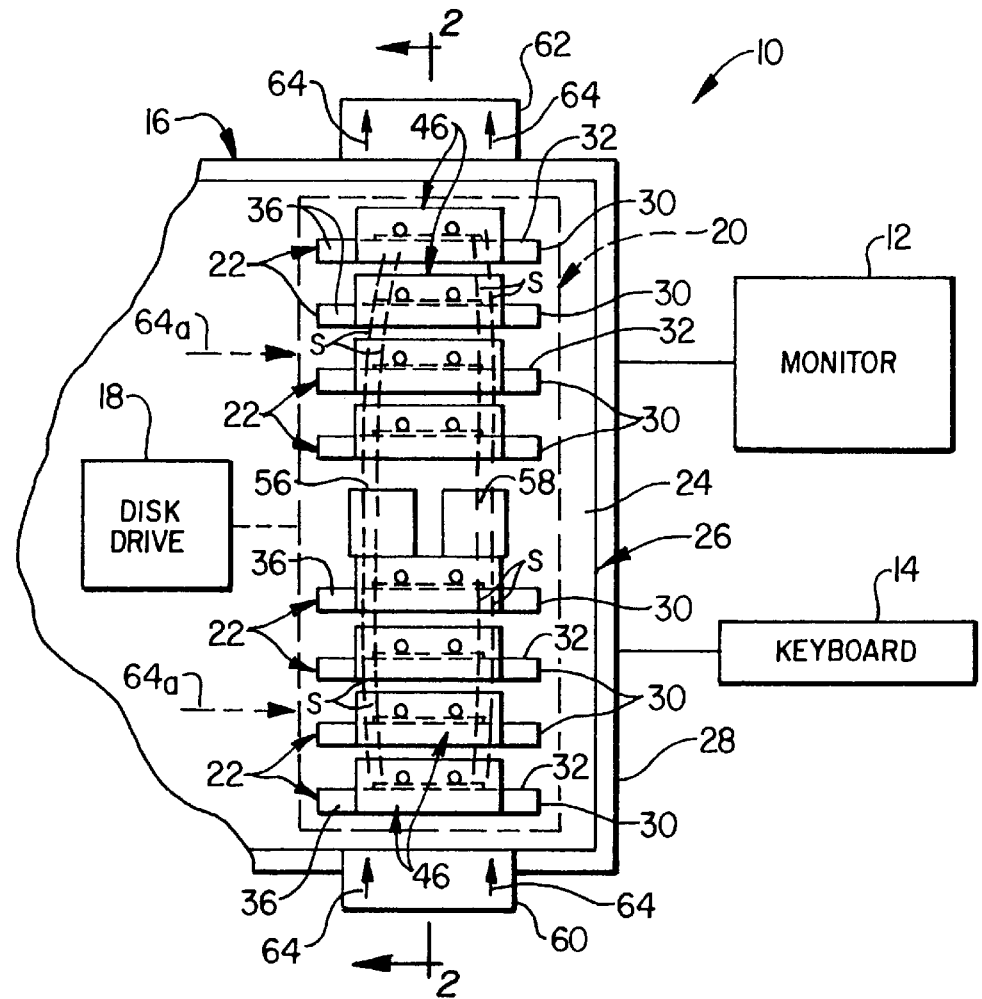
FIG. 1 is a schematic diagram of a computer system having a CPU unit, representatively a multi-processor server unit, in which a specially designed heat pipe-based processor cooling system embodying principles of the present invention is incorporated.

As schematically depicted in FIG. 1, the present invention provides electronic apparatus which is representatively in the form of a computer system 10 comprising a monitor 12 and keyboard 14 operatively coupled to a CPU unit 16. The CPU unit 16 is illustratively a multi-processor server unit and has a data storage device therein, such as a disk drive 18, for storing data that may be retrieved by a microprocessor portion 20 which includes a series (representatively eight in number) of closely spaced, individual high speed processor modules 22 that generate considerable operating heat during operation of the system 10. As later described herein, each of the processor modules 22 is removably mounted on the top side 24 of a main system circuit board 26 disposed within a housing portion 28 of the CPU unit 16 (see FIGS. 1 and 2).

Figure 3:
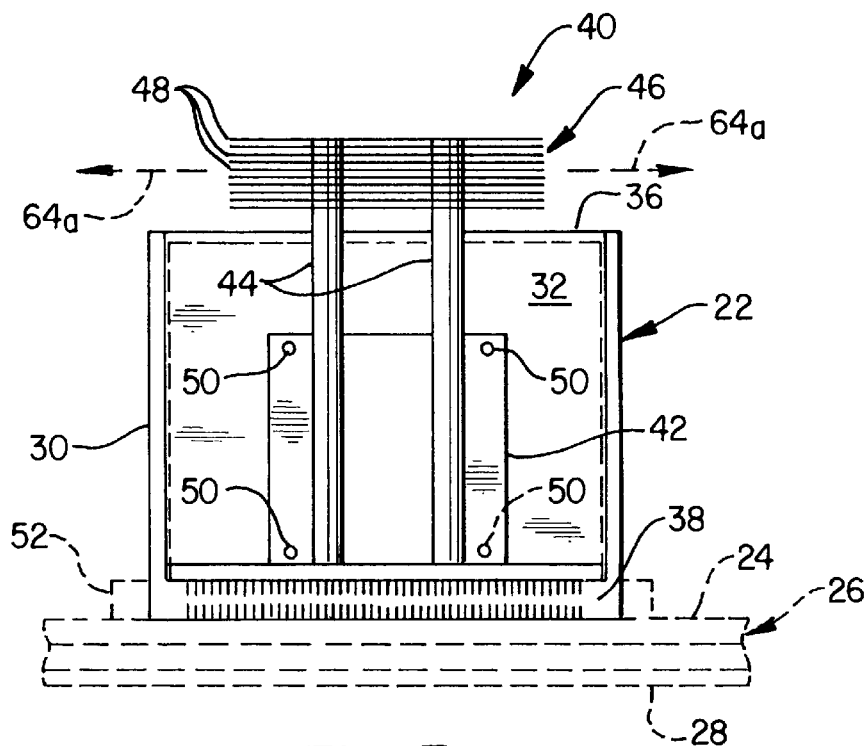
FIG. 3 is a simplified front side elevational view, taken along line 3—3 of FIG. 2, of one of a series of specially designed processor/heat pipe cooling device modules removably installed in the CPU unit.
Figure 4:
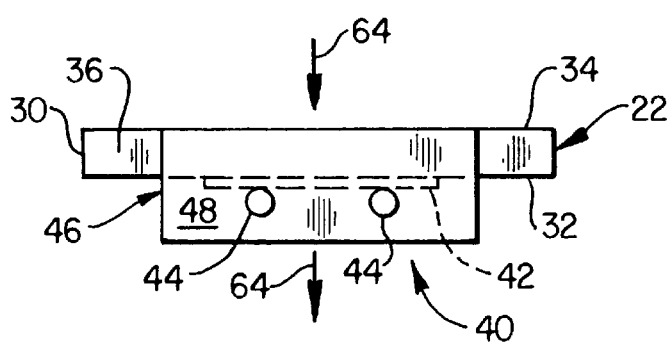
FIG. 4 is a top plan view of the processor/heat pipe cooling device module.
Figure 5:
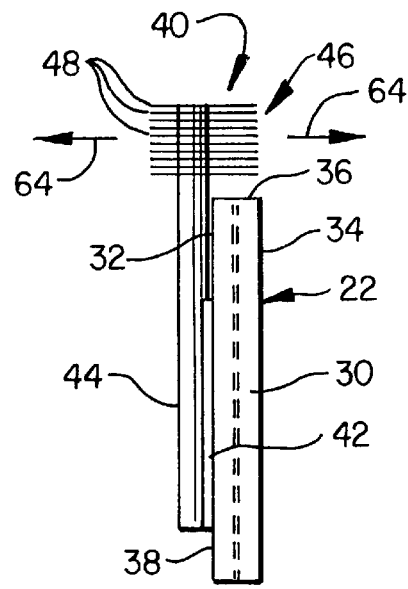
FIG. 5 is a right side elevational view of the processor/heat pipe cooling device module.

Turning now to FIGS. 3–5, each processor module 22 has a relatively thin, generally rectangular housing portion 30 having front and rear sides 32 and 34, an upper peripheral side edge 36, and a bottom side connector edge portion 38. Mounted on each of the module housings 30 is a specially designed heat dissipation structure 40 embodying principles of the present invention. Each heat dissipation structure 40 representatively includes (1) a collector member in the form of a rectangular metal evaporator plate 42, (2) a heat transfer structure defined by a pair of thermosyphoning heat pipes 44, and (3) a heat exchanger structure 46 defined by a spaced series of parallel, facing rectangular metal fin members 48.

Evaporator plate 42 is removably secured to the front side 32 of the processor module housing 30, above its bottom or inner connector edge portion 38, by screws 50 and is in a heat exchange relationship with the processor module 22 so as to conductively receive operating heat therefrom. The two thermosyphoning heat pipes 44 are in a spaced apart parallel relationship and longitudinally extend parallel to the front side 32 of the processor module housing 30, with lower end portions of the heat pipes 44 being secured to the front side of the evaporator plate 42 in a heat conductive relationship therewith, representatively using a suitable thermally conductive epoxy material.

As illustrated in FIGS. 3–5, at each processor module 22 the finned heat exchanger 46 is spaced upwardly apart from the upper peripheral side edge 36 of the module housing 30, with a rear side portion of the heat exchanger 46 overlying the upper peripheral side edge 36. The heat exchanger 46 is supported in this orientation (i.e., outside of the periphery of its associated processor module housing 30) on upper end portions of the heat pipes 44 which extend upwardly past the upper peripheral side edge 36 and transversely through the individual heat exchanger fin members 48 to which such upper heat pipe end portions are suitably secured in a heat transfer relationship therewith.

Figure 2:
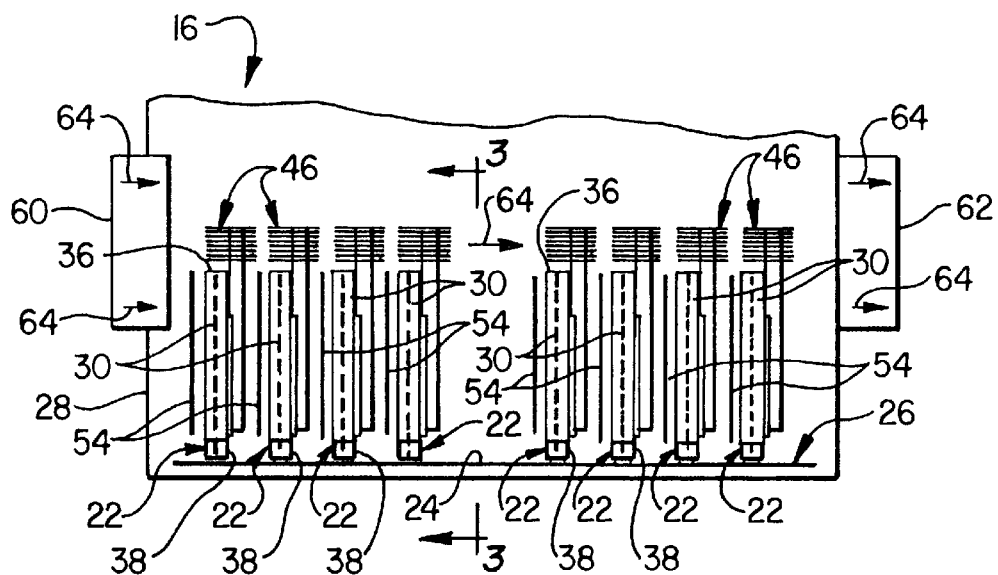
FIG. 2 is a simplified cross-sectional view through the CPU unit taken generally along line 2—2 of FIG. 1.

Turning now to FIGS. 1–3, the representative series of eight processor/heat dissipation structure modules 22,40 are arranged in a row, in two closely grouped sets of four processor/heat dissipation structure modules 22,40, on the top side 24 of the main system circuit board 26. The bottom connector edge portions 38 of the processor module housings 30 are removably received in suitable connector sockets 52 (see FIG. 3) on the top circuit board side 24. As can be seen in FIGS. 1 and 2, the processor module housings 30 are in a parallel, vertically oriented side-by-side facing relationship with all of the front sides 32 of the module housings 30 (i.e., the heat pipe sides thereof) facing in the same direction and the finned heat exchangers 46 being horizontally and vertically aligned with one another in a row corresponding to the row of underlying processor module housings 30.

A series of power supply modules (also commonly referred to as DC/DC power converters, voltage regulation modules), in the form of power connecter cards 54, are interdigitated with the module housings 30 as schematically depicted in FIG. 2, with the power converter cards 54 being vertically oriented as shown. Each of the power converter cards 54 is operatively coupled to an associated one of the processor modules 22, and is positioned above the top side 24 of the main system board 26 and somewhat below the level of the bottom sides of the finned heat exchangers 46. Each power converter card 54 is also removably coupled to its own connecter (not shown in FIG. 2) on the main system board 26. For purposes of illustrative clarity, the power converter cards 54 have not been shown in FIG. 1. Operatively positioned between the two sets of four removable processor/heat dissipation structure modules 22,40, as illustrated in FIG. 1, are two controller chips 56 and 58 which are operatively coupled to the processor modules 22 as well as various non-illustrated I/O and memory cards incorporated in the server 16. The illustrated side-by-side orientation of the processor modules 22 facilitates the depicted compact array of the various signal routing paths S (some of which are shown in phantom in FIG. 1) which advantageously minimizes the total signal trace path.

The server unit 16 is representatively provided with a push/pull processor cooling system that includes a pair of cooling fans 60 and 62 mounted on the housing 28 outwardly of opposite ends of the processor module row, as indicated in FIGS. 1 and 2, generally at the level of the finned heat exchangers 46. During operation of the server unit 16, heat generated by the processor modules 22 is conducted to the evaporator plates 42 and then transferred via the heat pipes 44 to the finned heat exchangers 46. At the same time, the fan 60 draws ambient air 64 into the housing 28 and "pushes" the air 64 horizontally through the heat exchangers 46, perpendicularly to the processor modules 22, while the fan 62 "pulls" air 64 through the heat exchangers 46 and then discharges the air 64 outwardly from the housing 28. Processor module operating heat delivered to the finned heat exchangers 46 via the heat pipes 44 is transferred to the cooling air 64 to thereby continuously cool the processor modules 22.

The unique positioning of the heat exchangers 46 outside of the peripheries of the processor modules 22, as well as outside of the spaces between adjacent pairs of processor modules 22 (i.e., outside of the spatial envelope of the array of processor modules), advantageously permits the adjacent processor module pairs to be considerably closer to one another than if they were conventionally provided with large heat sink structures on side surfaces thereof—even with the voltage regulation modules 54 interposed in the spaces between adjacent pairs of the processor modules 22. In turn, this permits the signal path lengths associated with the processor modules to be desirably reduced.

It is important to note that the substantial reduction in the spacing distance between adjacent pairs of processor modules 22, which yields such signal path length reduction, does not impair the ability to adequately cool the processor modules 22 since it is not necessary to force cooling air through the spaces between adjacent processor module pairs. Instead, as described above, the cooling air 64 travels through a path outside of the envelope of the processor module array—namely, between adjacent pairs of fins 48 in the heat exchangers 46.

The positioning of the finned heat exchangers 46 outside of the envelope of the processor module array yields the additional benefit of providing greatly enhanced cooling air flow directional flexibility. For example, while the illustrated direction of the cooling air 64 is representatively perpendicular to the processor modules 22, it could alternatively be parallel to the processor modules 22, as indicated by the dashed arrows 64 a in FIG. 3, or in any other direction generally parallel to the heat exchanger fins 48.

While the compact heat dissipation structures 40 have been representatively illustrated as being mounted on associated processor modules 22, they could also be advantageously utilized in conjunction with a wide variety of other types of heat-generating structures. As but one example, the heat dissipation structures 40 could also be directly connected to the power supply modules 54 which are interdigitated with the processor modules 22.

Finally, as can be seen in FIGS. 3–5, the compact incorporation of the heat dissipation structure 40 onto its associated processor module 22 desirably permits both the processor module 22 and its associated operating heat dissipation apparatus to be rapidly and easily installed on and later removed from the main system circuit board 26.

The foregoing detailed description is to be clearly understood as being given by way of illustration and example only, the spirit and scope of the present invention being limited solely by the appended claims.

What is claimed is:

1. Electronic apparatus comprising:

a spaced series of computer processor modules having opposite sides and being disposed within a spatial envelope in a facing, side-by-side relationship;

a spaced series of heat collector members interdigitated with said spaced series of computer processor modules;

a series of heat transfer structures having first portions secured to different ones of said heat collector members and operative to receive heat therefrom, and second portions disposed outwardly of said spatial envelope;

a series of heat exchanger structures secured to said second heat transfer structure portions and operative to receive heat therefrom;

a spaced series of power supply modules interdigitated with said series of computer processor modules; and a fluid flow system operative to flow a cooling fluid across said heat exchanger structures to receive heat therefrom.

2. The electronic apparatus of claim 1 wherein said electronic apparatus is a computer server unit.

3. The electronic apparatus of claim 1 wherein said spaced series of power supply modules are power converter cards.

4. The electronic apparatus of claim 1 wherein said series of heat transfer structures are heat pipes having first longitudinal portions secured to said heat collector members, and second longitudinal portions disposed outwardly of said spatial envelope and secured to said series of heat exchanger structures.

5. The electronic apparatus of claim 1 wherein said series of heat exchanger structures are finned heat exchangers.

6. The electronic apparatus of claim 1 wherein said fluid flow system is operative to flow cooling air across said heat exchanger structures.

7. The electronic apparatus of claim 6 wherein said fluid flow system includes:

a first fan having an outlet positioned to blow air across said heat exchanger structures, and a second fan having an inlet positioned to draw air across said heat exchanger structures.

8. The electronic apparatus of claim 1 further comprising a circuit board, and wherein said series of computer processor modules are removably connected to said circuit board.

9. Electronic apparatus comprising:

a series of computer processor modules;

a series of heat pipes having first longitudinal portions secured to said computer processor modules in thermal communication therewith, and second longitudinal portions spaced outwardly apart from said computer processor modules;

a series of heat exchanger structures secured to said second longitudinal heat pipe portions in thermal communication therewith and positioned for direct impingement by a cooling fluid flow; and a series of power converter cards interdigitated with said series of computer processor modules.

10. The electronic apparatus of claim 9 wherein said electronic apparatus is a computer unit.

11. The electronic apparatus of claim 9 wherein said heat exchanger structures are finned heat exchangers.

12. The electronic apparatus of claim 9 further comprising a fluid flow system operative to flow a cooling fluid across said heat exchanger structures.

13. The electronic apparatus of claim 12 wherein said fluid flow system includes fan means for flowing air across said heat exchanger structures.

14. A computer system comprising:

a microprocessor portion including a spaced series of computer processor modules having opposite sides and being disposed within a spatial envelope in a facing, side-by-side relationship;

a data storage device operative to store data that may be retrieved by said microprocessor portion;

a series of heat collector members interdigitated with said series of computer processor modules, a spaced series of power supply modules interdigitated with said series of computer processor modules;

a series of heat transfer structures having first portions secured to different ones of said collector members and operative to receive heat therefrom, and second portions disposed outwardly of said spatial envelope;

a series of heat exchanger structures secured to said second heat transfer structure portions and operative to receive heat therefrom; and a fluid flow system operative to flow a cooling fluid across said heat exchanger structures to receive heat therefrom.

15. The computer apparatus of claim 14 wherein said power supply modules are sower converter cards.

16. The computer system of claim 14 wherein said series of heat transfer structures are heat pipes having first longitudinal portions secured to said heat collector members, and second longitudinal portions disposed outwardly of said spatial envelope and secured to said series of heat exchanger structures.

17. The computer system of claim 14 wherein said series of heat exchanger structures are finned heat exchangers.

18. The computer system of claim 14 wherein said fluid flow system is operative to flow cooling air across said heat exchanger structures.

19. The computer system of claim 18 wherein said fluid flow system includes:

a first fan having an outlet positioned to blow air across said heat exchanger structures, and a second fan having an inlet positioned to draw air across said heat exchanger structures.

20. The computer system of claim 14 further comprising a circuit board, and wherein said computer processor modules are removably connected to said circuit board.

21. A computer system comprising:

a microprocessor portion including a series of computer processor modules;

a data storage device operative to store data that may be retrieved by said microprocessor portion;

a series of heat pipes having heat-receiving first longitudinal portions interdigitated with said computer processor modules, and second longitudinal portions spaced outwardly apart from said computer processor modules;

a series of power supply modules interdigitated with said computer processor modules; and a series of heat exchanger structures secured to said second longitudinal heat pipe portions in thermal communication therewith and positioned for direct impingement by a cooling fluid flow.

22. The computer system of claim 2 wherein said power supply modules are power converter cards.

23. The computer system of claim 21 wherein said heat exchanger structures are finned heat exchangers.

24. The computer system of claim 21 further comprising a fluid flow system operative to flow a cooling fluid across said heat exchanger structures.

25. The computer system of claim 24 wherein said fluid flow system includes fan means for flowing air across said heat exchanger structures.

* * * * *